United States Patent [19]

Kimura et al.

[11] Patent Number: 4,700,299

[45] Date of Patent: Oct. 13, 1987

[54] RADIATION IMAGE SIGNAL COMPRESSION METHOD AND APPARATUS

[75] Inventors: Tsutomu Kimura; Yuichi Fuseda; Kazuhiro Hishinuma, all of Kanagawa, Japan

[73] Assignee: Fuji Photo Film Co., Ltd., Kanagawa, Japan

[21] Appl. No.: 618,858

[22] Filed: Jun. 8, 1984

[30] Foreign Application Priority Data

Jun. 9, 1983 [JP] Japan ............................ 58-103069

[51] Int. Cl.$^4$ ............................................. H04N 7/18
[52] U.S. Cl. ................................. 364/414; 358/111; 378/99
[58] Field of Search .............. 364/414; 358/111, 160; 378/99

[56] References Cited

U.S. PATENT DOCUMENTS 4,458,267  7/1984  Dolazza ........................... 364/414 X
4,533,946  8/1985  Yasuhara et al. ................ 364/414 X
4,561,019  12/1985  Lizzi et al. ..................... 364/414 X
4,573,035  2/1986  Dolazza ........................... 358/167 X
4,603,254  7/1986  Takano et al. .................. 364/414 X Primary Examiner—Jerry Smith
Assistant Examiner—Charles B. Meyer
Attorney, Agent, or Firm—Sughrue, Mion, Zinn, Macpeak & Seas

[57] ABSTRACT

In a system for compressing radiation image signals, code tables for use in entropy encoding for signal compression are created and classified in accordance with combinations of human body portions of radiation images with image recording conditions thereof. The optimal table is selected from the classified tables in accordance with the combination of the human body portion of the radiation image with the image recording conditions thereof which are inputted from a keyboard. Radiation image signals obtained by reading out the radiation image are compressed by use of the optimal table, thereby quickly achieving efficient signal compression.

6 Claims, 2 Drawing Figures

RADIATION IMAGE SIGNAL COMPRESSION METHOD AND APPARATUS

BACKGROUND OF THE INVENTION

1. Field of the Invention

This invention relates to a method of compressing image signals, and an apparatus for carrying out the method. This invention particularly relates to a method of and apparatus for compressing image signals wherein digital signals of a radiation image of the human body are optimally entropy-encoded when radiation image information obtained by reading out the radiation image of the human body is stored as digital signals in a storage medium.

2. Description of the Prior Art

When image signals or the like are stored in memory media such as magnetic tapes for later use, it is desired to compress the image signals for the purpose of storing large amounts of signals in as small storage space as possible. Thus various signal compression systems have heretofore been proposed and employed. One example of the signal compression systems is the entropy encoding system wherein digital signals are encoded by use of values on the order of entropy. In an entropy encoding system, a Huffman code, a Shannon-Fano code, or the like is used.

In the aforesaid entropy encoding system, a code consisting of a small number of bits (for example, the Huffman code) is assigned to signals exhibiting high appearance probability among the signals of various values which arise, and a code consisting of a comparatively large number of bits is assigned to signals exhibiting low appearance probability. As a result, the total number of bits used for encoding is reduced to compress the amount of signals.

For entropy encoding as described above, it is necessary to prepare an encoding table suitable for the kind of signal (the information) to be encoded. That is, effective signal compression cannot be realized by the entropy encoding unless the encoding table is suitable for the kind of signal. Specifically, in order to efficiently compress, for example, image signals by entropy encoding, it is necessary to create an optimal encoding table on the basis of a statistical analysis of each image and to carry out signal compression by use of the created table.

Therefore, in the entropy encoding system as described above, it is necessary to prepare a separate table for entropy encoding for each image, which will realize effective data compression. However, an extra time and labor are required for the preparation of the tables. Accordingly, the entropy encoding system is disadvantageous in practical use.

The aforesaid entropy encoding system is thus desired to be improved particularly when it is necessary to process and store large numbers of images.

SUMMARY OF THE INVENTION

The primary object of the present invention is to provide an image signal compression method advantageous for storing of image signals particularly of a radiation image of the human body, and an apparatus for carrying out the method.

Another object of the present invention is to provide an image signal compression method wherein digital signals are quickly entropy-encoded in a manner suitable for the type of image and in a simple manner at a high efficiency when radiation image information obtained by reading out a radiation image of the human body is stored as digital signals in a stored medium.

The present invention provides a radiation image signal compression method for entropy-encoding digital signals and storing the entropy-encoding signals when the radiation image information obtained by reading out a radiation image of the human body is stored as digital signals in a stored medium, wherein the improvement comprises creating and classifying tables for use in the entropy encoding in accordance with combinations of human body portions of radiation images with image recording conditions of said radiation images, selecting and using one of said classified tables in accordance with the combination of the human body portion of said radiation image with the image recording conditions of said radiation image.

Theoretically, it would be most desirable to create a separate table for use in entropy encoding for each image. However, it was found that the radiation images of the human body are similar to each other in image type, i.e. in statistical properties with respect to entropy encoding, when the combinations of the human body portions of the radiation images (e.g. the head, frontal chest, abdomen, and mamma) with the image recording conditions of the radiation images (e.g. plain image recording, tomography, and contrasted image recording) are the same. It was also found that, when the tables are classified in accordance with the combinations of the human body portions of the radiation images with the image recording conditions thereof and entropy encoding is conducted by use of the same table for the radiation images belonging to the same combination, practically no significant difference arises in compression efficiency between the radiation images and almost optimal signal compression can be achieved. Accordingly, in the present invention, tables are created in advance in accordance with the above-described classification and one of the tables is selected in accordance with the combination of the human body portion of the radiation image with the image recording condition thereof for use in the entropy encoding.

In the present invention, it is not necessary to prepare a table for each image, and it is possible to automatically select a suitable table simply by inputting the human body portion of the radiation image and the image recording conditions thereof. Therefore, the efficiency of entropy encoding becomes very high, and signal compression can be realized practically very easily. Especially, since the signal compression method and apparatus in accordance with the present invention are used for storing the signals of radiation images of the human body for diagnostic purposes, the present invention is advantageous in that it improves the efficiency of diagnosis and markedly reduces the memory capacity requirement for diagnoses. The effects of the present invention on the reduction of the memory capacity requirement and the shortening of the time required for signal compression are advantageous particularly for a system used in a mobile X-ray diagnostic station for mass medical examinations. Thus the present invention markedly contributes to the field of the medical diagnosis and medical examination technology.

In the present invention, it is possible to compress image signals to about one half to one third, and thus to increase the apparent memory capacity by a factor of two to three times.

DESCRIPTION OF THE PREFERRED EMBODIMENTS

The present invention will hereinbelow be described in further detail with reference to the accompanying drawings.

Figure 1:
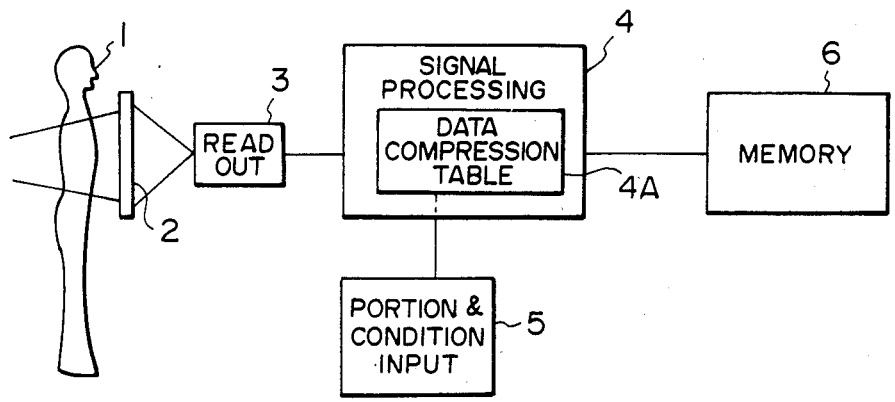
FIG. 1 is a block diagram showing a radiation image recording system wherein an embodiment of the radiation image signal compression apparatus for carrying out the method in accordance with the present invention is employed.

Referring to FIG. 1, an image recording medium 2 for recording an X-ray transmission image of an object 1 is positioned near the object 1. To the rear of the image recording medium 2 is positioned a read-out means 3 for photoelectrically scanning and reading out the X-ray transmission image. The configuration is not limited to the one shown in FIG. 1, and any other configuration may be employed insofar as an image of a radiation such as X-rays passing through a portion of an object can be recorded in a radiation image recording medium (including such a medium as an intensifying screen) and image signals can then be obtained by photoelectrically reading out the radiation transmission image recorded in the medium. For example, the radiation image recording medium may be a stimulable phosphor sheet as described in U.S. Pat. No. 4,258,264 or a conventional X-ray film.

The image signals obtained as described above are input into a signal processing means 4 including a signal compression circuit provided with tables 4A of codes for entropy encoding, such as Huffman code or Shannon-Fano code. Many tables 4A are created and classified in advance in accordance with the combinations of human body portions of radiation images with the image recording conditions thereof. One of the tables 4A is selected by a means 5 for inputting the human body portion of the radiation image and the image recording conditions thereof, and the image signals are entropy-encoded by use of the selected table 4A in the signal processing means 4. The entropy-encoded image signals are then stored in a storage means 6 such as a magnetic tape.

The signal processing means 4 comprises a digital circuit for compressing the digital signals by use of the tables for encoding into the Huffman codes and the like, and a known signal processing circuit may be used as the digital circuit.

Figure 2:
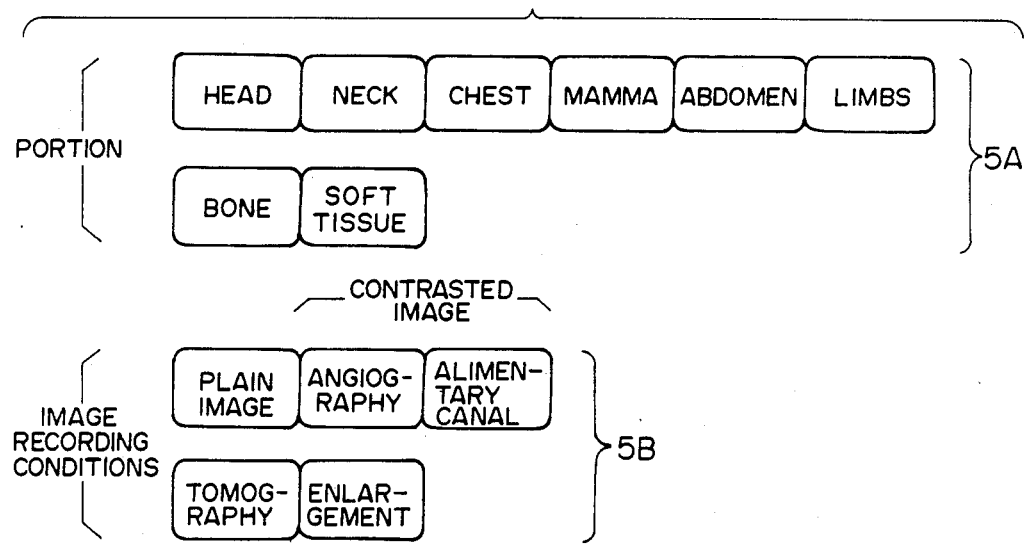
FIG. 2 is a schematic view showing an example of the arrangement of keys employed as an embodiment of the means for inputting the human body portion of a radiation image and the image recording conditions thereof in the apparatus of FIG. 1.

The means 5 for inputting the human body portion of a radiation image and the image recording conditions thereof comprises an input device such as a keyboard for inputting the human body portion of a radiation image recorded, the image recording conditions thereof, and the like, and is provided e.g. with keys as shown in FIG. 2. Specifically, the means 5 for inputting the human body portion of a radiation image and the image recording conditions thereof is provided with human body portion inputting keys 5A for inputting the image recording portion of a human body, such as the head or frontal chest, and the image portion which should be enhanced (i.e. whether to enhance a bone or a soft tissue). The means 5 is also provided with image recording condition inputting keys 5B for inputting the image recording method (plain image recording, angiography, contrasted image recording for the alimentary canal, or the like) and special image recording systems such as tomography or enlargement radiography. When the keys 5A and 5B are depressed, the means 5 outputs signals necessary for the classification of the radiation image recorded in the image recording medium 2.

By use of the inputting means 5 constructed as described above, signals necessary for the classification of the radiation image are obtained. A table 4A for signal compression is selected on the basis of the signals output from the inputting means 5.

By way of example, when the Huffman code is used, radiation images can be classified very simply in accordance with the human body portion and the image recording conditions as shown in Table 1.

TABLE 1

| Portion | Image recording conditions | Table for encoding into Huffman code |
|---|---|---|
| Mamma | Simple image recording, tomography, enlargement. | A |
| Abdomen | Contrasted image recording for alimentary canal. | B |
| Others | Simple image recording, tomography, enlargement, angiogram. | C |

For example, the tables as shown below are be used as the tables A, B and C for encoding into the Huffman code.

| Table A for encoding into Huffman code | |
|---|---|
| Difference value | Code |
| 7 | *000011000 |
| 6 | *000010110 |
| 5 | *00001101 |
| 4 | *0000111 |
| 3 | *00110 |
| 2 | *0010 |
| 1 | *011 |
| 0 | *1 |
| −1 | *010 |
| −2 | *0001 |
| −3 | *00111 |
| −4 | *0000100 |
| −5 | *00001010 |
| −6 | *000010111 |
| −7 | *000011001 |
| others | *000001 |

| Table B for encoding into Huffman code | |
|---|---|
| Difference value | Code |
| 16 | *110101000 |
| 15 | *110100110 |
| 14 | *001111000 |
| 13 | *001111110 |
| 12 | *11010101 |
| 11 | *00111101 |
| 10 | *1101011 |
| 9 | *0011100 |
| 8 | *110111 |
| 7 | *10100 |
| 6 | *00001 |
| 5 | *1000 |
| 4 | *1011 |
| 3 | *1110 |
| 2 | *0001 |
| 1 | *0110 |

-continued

| Table B for encoding into Huffman code | |
|---|---|
| Difference value | Code |
| 0 | *010 |
| −1 | *0111 |
| −2 | *0010 |
| −3 | *1111 |
| −4 | *1100 |
| −5 | *1001 |
| −6 | *00110 |
| −7 | *10101 |
| −8 | *110110 |
| −9 | *0011101 |
| −10 | *1101000 |
| −11 | *00111110 |
| −12 | *11010010 |
| −13 | *001111111 |
| −14 | *001111001 |
| −15 | *110100111 |
| −16 | *110101001 |
| others | *000001 |

| Table C for encoding into Huffman code | |
|---|---|
| Difference value | Code |
| 10 | *001000100 |
| 9 | *001000010 |
| 8 | *00100011 |
| 7 | *0010011 |
| 6 | *0000011 |
| 5 | *000111 |
| 4 | *00101 |
| 3 | *00001 |
| 2 | *011 |
| 1 | *111 |
| 0 | *10 |
| −1 | *110 |
| −2 | *010 |
| −3 | *0011 |
| −4 | *00010 |
| −5 | *000110 |
| −6 | *0000010 |
| −7 | *0010010 |
| −8 | *00100000 |
| −9 | *001000011 |
| −10 | *001000101 |
| others | *0000001 |

We claim:

1. A radiation image signal compression method for entropy-encoding digital signals and storing the entropy-encoded signals when radiation image information obtained by reading out a radiation transmission image of the human body is stored as digital signals in a storage medium, wherein the improvement comprises the steps of creating and classifying tables for use in entropy encoding in accordance with combinations of human body portions of radiation images with image recording conditions of said radiation images, and selecting and using one of said classified tables in accordance with the combination of the human body portion of said radiation image with the image recording conditions of said radiation image, said one of said classified tables being selected in accordance with selection of more than one of said human body portions.

2. A method as defined in claim 1 wherein said tables are for encoding into Huffman codes.

3. A method as defined in claim 1 wherein said tables are for encoding into Shannon-Fano codes.

4. An apparatus for compressing radiation image signals, which comprises:
   (i) an inputting means for inputting a human body portion of a radiation transmission image of a human body and image recording conditions of said radiation transmission image,
   (ii) a plurality of tables for use in entropy encoding for signal compression, said tables being classified in accordance with the combination of said human body portion with said iamge recording conditions,
   (iii) a signal processing means for selecting the optimal table from a plurality of said classified tables in accordance with the combination of said human body portion with said image recording conditions input by said inputting means, said optimal table being selected in accordance with selection of more than one of said human body portions, and compressing image signals obtained by reading out said radiation transmission image by use of said optimal table, and
   (iv) storage means for storing the compressed image signals.

5. An apparatus as defined in claim 4 wherein said tables are for encoding into Huffman codes.

6. An apparatus as defined in claim 4 wherein said tables are for encoding into Shannon-Fano codes.

* * * * *